United States Patent [19]

Fukasawa et al.

[11] Patent Number: 5,310,453
[45] Date of Patent: May 10, 1994

[54] PLASMA PROCESS METHOD USING AN ELECTROSTATIC CHUCK

[75] Inventors: Kazuo Fukasawa, Kofu; Ryo Nonaka, Yamanashi; Kousuke Imafuku, Kufu, all of Japan

[73] Assignee: Tokyo Electron Yamanashi Limited, Nirasaki, Japan

[21] Appl. No.: 17,379

[22] Filed: Feb. 12, 1993

[30] Foreign Application Priority Data

Feb. 13, 1992 [JP] Japan ................................. 4-059366
Feb. 13, 1992 [JP] Japan ................................. 4-059367
Mar. 25, 1992 [JP] Japan ................................. 4-098924

[51] Int. Cl.$^5$ ..................... H01L 21/00; H01L 21/02; H01L 21/306; B44C 1/22
[52] U.S. Cl. ................................... 156/643; 437/225; 437/228
[58] Field of Search ................. 156/643; 437/225, 228; 118/50.1, 620, 723, 728

[56] References Cited

U.S. PATENT DOCUMENTS

| 5,184,398 | 2/1993 | Moslehi et al. | 361/234 |
| 5,221,403 | 6/1993 | Nozawa et al. | 156/643 |
| 5,250,137 | 10/1993 | Arami et al. | 118/728 |
| 5,255,153 | 10/1993 | Nozawa et al. | 361/234 |

FOREIGN PATENT DOCUMENTS

0051542 2/1992 Japan .

Primary Examiner—William Powell
Assistant Examiner—B. Everhart
Attorney, Agent, or Firm—Oblon, Spivak, McClelland, Maier & Neustadt

[57] ABSTRACT

Prior to plasma etching, a wafer is placed on conductive support pins which extend through an electrostatic chuck. The electrostatic chuck is disposed on a susceptor incorporating a cooling jacket. A potential for electrostatic attraction is applied to the electrostatic chuck. The support pins are lowered while they are grounded, thus placing the wafer on the electrostatic chuck. Subsequently, the support pins are retracted into the electrostatic chuck to release contact between the wafer and themselves. A heat medium gas is then supplied between the wafer and the electrostatic chuck to improve the heat transfer rate therebetween. A plasma is then generated in a process chamber, and the wafer is etched by using the plasma. Since the heat transfer rate between the wafer and the electrostatic chuck is improved before the generation of the plasma, damage to the wafer due to heat can be prevented, and the starting time required to start an etching process is shortened.

14 Claims, 6 Drawing Sheets

PLASMA PROCESS METHOD USING AN ELECTROSTATIC CHUCK

BACKGROUND OF THE INVENTION

1. Field of the Invention

The present invention relates to a method of processing a substrate to be processed, e.g., a semiconductor wafer, by using a plasma.

2. Description of the Related Art

In a semiconductor device manufacturing process, various kinds of plasma processes such as plasma etching are performed with respect to a semiconductor wafer in a process chamber in a vacuum atmosphere. An electrostatic chuck having a first electrode interposed between two insulating layers is disposed on the wafer table in the process chamber in order to fix the wafer on the table. A second electrode is formed apart from the first electrode.

In a plasma etching apparatus, while the process chamber as the second electrode is grounded, RF power is supplied to the wafer table to generate a plasma around the wafer placed on the electrostatic chuck. The wafer is grounded through the plasma. When a high voltage is applied to the first electrode of the electrostatic chuck, positive and negative charges are respectively produced in the wafer and the first electrode, so that the wafer is attracted/held to/on the wafer table by the Coulomb force acting between the wafer and the first electrode. Etching is performed in this state. When the etching is completed, the supply of the RF power to the wafer table and the application of the high voltage to the first electrode are stopped. Subsequently, the processed wafer is unloaded, and the next wafer is loaded.

It is empirically known that the attractive force of the electrostatic chuck is reduced as a plasma process is repeated by the above-described method. This phenomenon is especially conspicuous when the insulating layers of the electrostatic chuck are made of polyimide. Although an exact cause for this phenomenon is not identified yet, a likely cause is that residual charges are accumulated on the support surface of the electrostatic chuck, and the Coulomb force acting between a wafer and the first electrode is decreased by the residual charges.

Furthermore, in the plasma etching apparatus, a temperature adjusting portion such as a cooling portion is arranged in the wafer table to adjust the temperature of a wafer. In addition, the space between the wafer and the electrostatic chuck is filled with a gas serving as a heat transfer medium, e.g., He, in order to improve the heat transfer rate between the wafer and the electrostatic chuck. Filling of the heat transfer gas must be performed after the wafer is fixed by the electrostatic chuck. For this reason, in a conventional method, filling of a heat transfer gas is performed after the following sequence of steps: placing a wafer on the electrostatic chuck; and applying a voltage to the electrostatic chuck to generate a plasma, thereby causing the wafer to be grounded through the plasma and fixed on the table. In this conventional sequence, however, an increase in the temperature of the wafer upon generation of the plasma cannot be adjusted until filling of the heat transfer gas is completed. Therefore, the wafer may be adversely affected by such an increase in temperature. In addition, the starting time required to start an etching process is prolonged.

SUMMARY OF THE INVENTION

It is an object of the present invention to provide a plasma process method which can maintain the strong attractive force of an electrostatic chuck even if a plasma process is repeatedly performed.

It is another object of the present invention to provide a plasma process method which can prevent a substrate to be processed from being damaged by an increase in temperature at the start of a plasma process, and can shorten the starting time required to start a plasma process.

According to the first aspect of the present invention, there is provided a plasma process method using a plasma process apparatus including:

a process chamber capable of attaining vacuum;

a support table for supporting a substrate to be processed in the process chamber;

an electrostatic chuck arranged on the support table, the electrostatic chuck including a conductive layer and an insulating layer formed on the conductive layer and constituting a substrate support surface;

conductive support means, arranged in the chamber, for transferring the substrate onto the electrostatic chuck;

plasma generating means for generating a plasma in the process chamber; and means for supplying a heat medium gas between the substrate and the electrostatic chuck, the method comprising the steps of:

placing the substrate on the support means in the process chamber;

applying a potential for electrostatic attraction to the electrostatic chuck;

transferring the substrate onto the insulating layer of the electrostatic chuck by using the support means while the support means is grounded;

releasing contact between the substrate and the support means;

supplying the heat medium gas between the substrate and the electrostatic chuck;

generating a plasma in the process chamber; and processing the substrate by using the plasma.

According to the second aspect of the present invention, there is provided a plasma process method using a plasma process apparatus including:

a process chamber capable of attaining vacuum;

a support table for supporting a substrate to be processed in the process chamber;

an electrostatic chuck arranged on the support table, the electrostatic chuck including a conductive layer and an insulating layer formed on the conductive layer and constituting a substrate support surface; and plasma generating means for generating a plasma in the process chamber, the method comprising the steps of:

processing the substrate by using the plasma in the process chamber in which the plasma is generated, while the substrate is held by the electrostatic chuck;

removing the substrate from the electrostatic chuck upon completion of the process; and removing charges from the substrate support surface when or after contact between the substrate and the substrate support surface of the electrostatic chuck is released.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
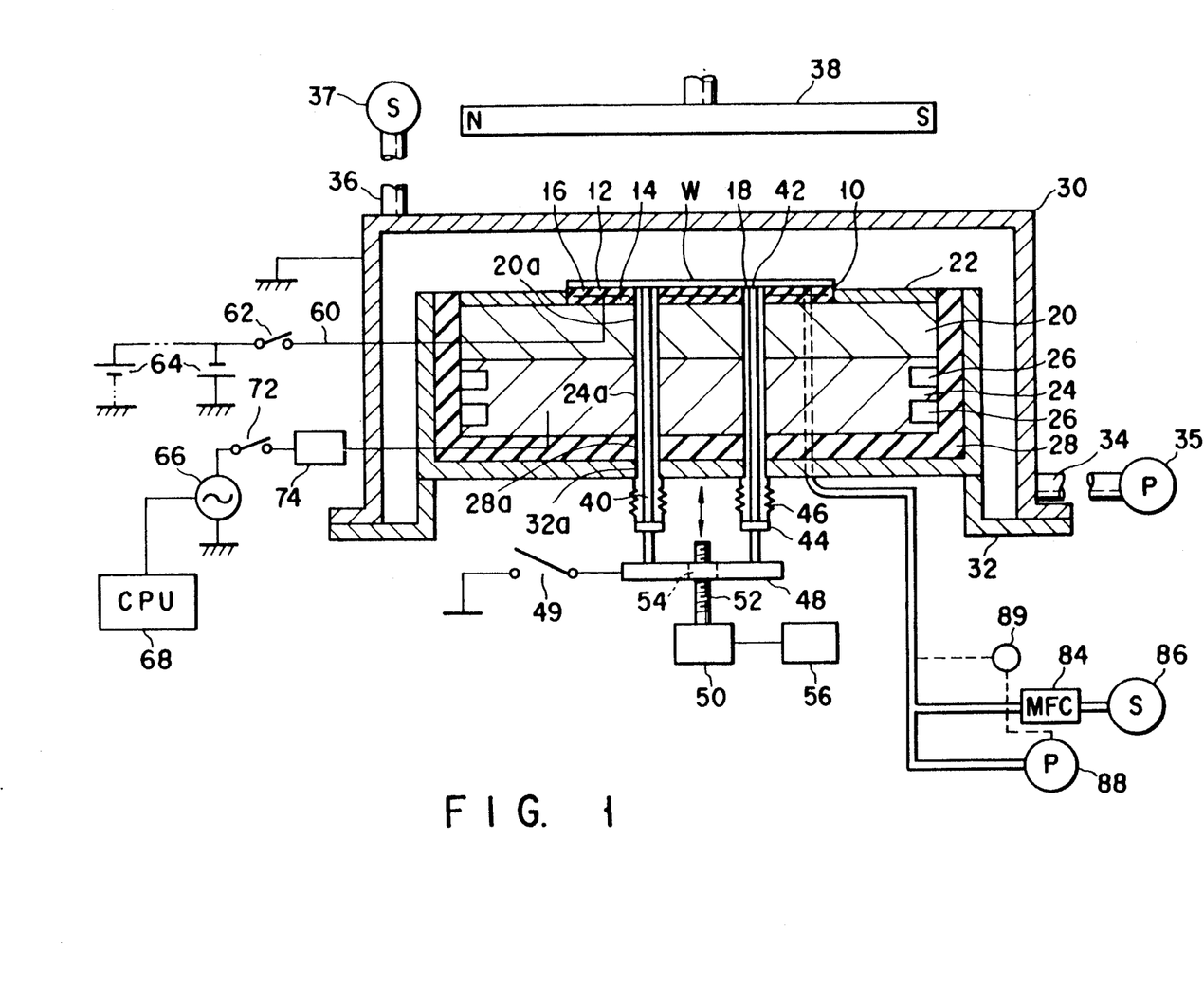
FIG. 1 is a schematic sectional view of a plasma etching apparatus according to an embodiment of the present invention.

In a plasma etching apparatus according to an embodiment of the present invention shown in FIG. 1, first and second susceptors 20 and 24, on which a wafer W as an object to be processed is placed, are disposed in a process chamber 1. An electrostatic chuck 10 for attracting/holding the wafer W is disposed on the first susceptor 20.

The electrostatic chuck 10 is formed by inserting a conductive sheet 16 as a conductive layer between upper and lower polyimide sheets 12 and 14 as insulating layers. Three through holes 18 (only two of them are shown in FIG. 1) are formed in the electrostatic chuck 10 to extend from the upper surface to the lower surface. Pusher pins 40 serving as unloading means (to be described later) can extend through the holes 18, respectively. A DC power source 64 is connected to the conductive sheet 16 of the electrostatic chuck 10 through a feeder path 60 and a switch 62. When a high voltage is applied from the power source 64 to the conductive sheet 16, a Coulomb force is generated between the wafer W and the conductive sheet 16, and the wafer W is attracted/held to/on the electrostatic chuck 10.

The first susceptor 20 consists of a conductive material such as aluminum. A focus ring 22 is disposed on the surface of the first susceptor 20 to surround the electrostatic chuck 10. The focus ring 22 consists of a conductive material such as glass-like carbon or SiC and an insulating material such as quartz glass. The lower surface of the first susceptor 20 is detachably fixed to the second susceptor 24. Similar to the first susceptor 20, the second susceptor 24 consists of a conductive material such as aluminum. The second susceptor 24 incorporates a cooling jacket 26 and serves to cool the wafer W to about $-10°$ C. to $-100°$ C. through the first susceptor 20 and the electrostatic chuck 10. The first and second susceptors 20 and 24 are stored in an insulating ceramic frame 28 such that their side and bottom surfaces are covered. Therefore, only the surfaces of the electrostatic chuck 10 and the focus ring 22 on the first susceptor 20 are exposed in the process chamber 1.

In order to improve the heat transfer rate between the wafer W and the electrostatic chuck 10, a heat medium or transfer gas, e.g., He, is supplied between the wafer W and the electrostatic chuck 10. The heat transfer gas is supplied through a line 82 extending through the electrostatic chuck 10, the first and second susceptors 20 and 24, the insulating ceramic frame 28, and the process chamber 1. The line 82 is connected to a heat transfer gas source, e.g., an He source 86, through a mass flow controller (MFC) 84. In addition, a vacuum pump 88 having a variable exhaust conductance is connected to the line 82. The pump 88 is controlled by a pressure controller 89 for detecting the internal pressure of the line 82. Similarly, by supplying a heat transfer gas such as He between the first and second susceptors 20 and 24, the heat transfer rate therebetween can be improved.

The process chamber 1 is constituted by an upper case 30 and a lower case 32. The upper and lower cases 30 and 32 are made of a conductive material such as aluminum. The lower case 32 has a cylindrical shape with a bottom so that the insulating ceramic frame 28 can be fitted therein. The upper case 30 has a cylindrical shape which is formed to cover the electrostatic chuck 10, the focus ring 22, and the side wall of the lower case 32 with a gap. The lower rim of the upper case 30 is coupled/fixed to the lower case 32.

Holes 20a, 24a, 28a, and 32a are respectively formed in the first susceptor 20, the second susceptor 24, the insulating ceramic frame 28, and the lower case 32 at positions aligned with the holes 18 of the electrostatic chuck 10 so as to allow the insertion of the pusher pins 40.

The process chamber 1 constituted by the upper and lower cases 30 and 32 can be evacuated and allows introduction of an etching gas. For these purposes, a vacuum pump 35 and an etching gas source 37 are connected to the process chamber 1 through an exhaust pipe 34 and an inlet pipe 36, respectively.

The upper case 30 is grounded, and RF power is supplied from an RF power source 66 to the first and second susceptors 20 and 24. With this operation, a counter electrode of the RIE scheme for forming an RF electric field near the wafer W is formed. The RF power output of the RF power source 66 is controlled by a CPU 68. The RF power source 66 is connected to the second susceptor 24 through a switch 72 and an impedance tuner 74.

The grounded upper case 30 is used as the other electrode for an electrostatic chuck. When a plasma is generated, the wafer W is grounded through the plasma and the upper case 30. In this state, when a high voltage is applied to the electrostatic chuck 10, a so-called monopole type electrostatic chuck is formed, and the wafer W is attracted onto the electrostatic chuck 10.

A permanent magnet 38 is disposed outside and above the upper case 30 at a position opposing the wafer W. A horizonal magnetic field perpendicular to the RF electric field is formed by the permanent magnet 38 to cause a cyclotron motion of electrons contributing to the generation of a plasma. In addition, when the permanent magnet 38 is rotated to rotate the magnetic field, the uniformity of an etching process within the plane of the wafer surface is improved. By forming the horizontal magnetic field near the wafer W, the flying direction of ions becomes perpendicular to the surface of the wafer W, thus realizing highly anisotropic etching.

Each pusher pin 40 is designed to move vertically such that a distal end 42 of the pin 40 protrudes upward from the surface of the electrostatic chuck 10. Bellows 46 are disposed between a fixing end member 44 formed on the lower side of the pin 40 and the lower case 32 so that the vertical movement path of the pusher pin 40 has a hermetic structure. The end member 44 of the pusher pin 40 is coupled to a vertical moving plate 48 and hence is moved upward and downward upon driving of the vertical moving plate 48. The plate 48 is connected to a driving source, e.g., a pulse motor 50 through an output shaft 52. The vertical moving plate 48 includes an insulating member 54 having a female thread formed therein. The insulating member 54 is threadably engaged with the output shaft 52. With this arrangement, the rotational force of the pulse motor 50 is converted into a force for linearly driving the vertical moving plate 48.

A pulse from a motor driving section 56 is input to the pulse motor 50, and the motor 50 is driven in accordance with this pulse. A specific number of pulses corresponding to the interval between the instant at which the pusher pin 40 starts to move from the lower dead point and the instant at which the distal end 42 comes into contact with the wafer W is set in advance. The distal end 42 of the pusher pin 40 is temporarily stopped when it comes into contact with the lower surface of the wafer W. Thereafter, the pusher pin 40 is pushed upward to separate the wafer W from the electrostatic chuck 10. The pusher pin 40, the end member 44, and the vertical moving plate 48 each consist of a conductive metal.

The plate 48 is grounded through an opening/closing switch 49. While the wafer W is conveyed, the opening/closing switch 49 is closed, and the pusher pin 40 is grounded. After the wafer W is placed on the electrostatic chuck 10 to be etched, the opening/closing switch 49 is opened to electrically separate the wafer W from the ground.

A processing method in the above-described apparatus will be described next.

Figure 2:
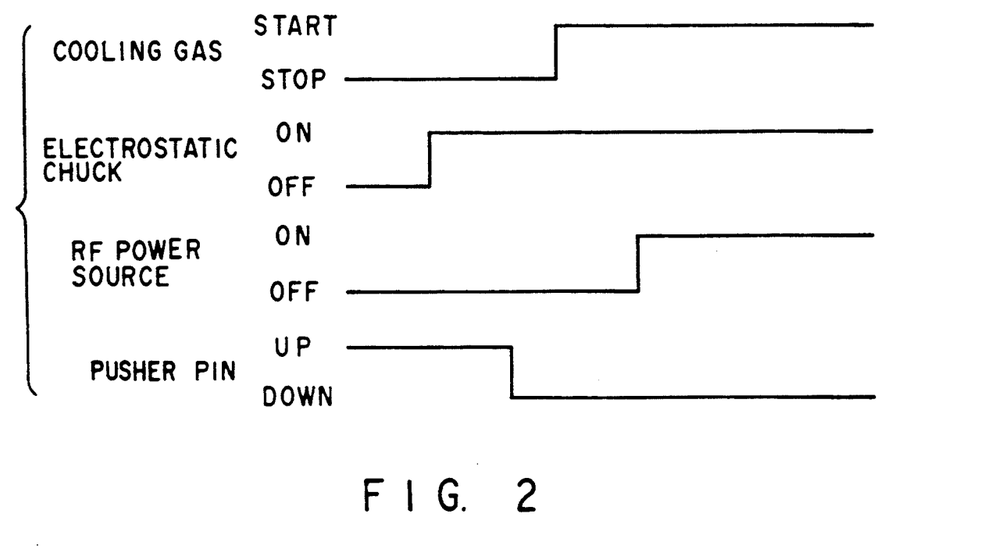
FIG. 2 is a timing chart showing an operation at the start of a plasma process.

In the process chamber 1 which is set in a vacuum state in advance, the wafer W is placed on the distal ends of the pins 40 protruding from the electrostatic chuck 10. In this case, the pins 40 are grounded through the plate 48. In this state, as indicated by the timing chart in FIG. 2, the switch 62 is closed, and a negative or positive potential is applied from the DC power source 64 to the conductive sheet 16 of the electrostatic chuck 10. At this time, a weak Coulomb force is generated between the wafer W on the grounded pins 40 and the conductive sheet 16.

The motor 50 is then driven to lower the pins 40, so that the wafer W is placed on the insulating layer 12 of the electrostatic chuck 10. When the wafer W is supported on the polyimide sheet 12, and the pins 40 are separated from the wafer W, the wafer W is left on the polyimide sheet 12 while it is kept charged by the potential of the ground. For this reason, a relatively strong Coulomb force is generated between the wafer W and the conductive sheet 16 with the negative or positive potential, which oppose each other through the thin insulating layer 12. As a result, the wafer W is fixed/held on the electrostatic chuck 10.

A heat transfer gas is supplied between the wafer W and the electrostatic chuck 10 through the line 82. At this time, even if the pressure of the supplied heat transfer gas acts on the wafer W, since the wafer W is fixed on the electrostatic chuck 10, no positional shift of the wafer W occurs.

Subsequently, an etching gas is introduced into the process chamber 1 while the switch 72 of the RF power source 66 is closed, and the permanent magnet 38 is rotated to generate a plasma, thus starting an etching process. In this stage, the heat transfer between the wafer W and the electrostatic chuck 10 has been compensated by the heat transfer gas, and the temperature of the wafer W has already been adjusted by the cooling jacket 26. With this operation, an inadvertent rise in the temperature of the wafer W is prevented, and hence damage to the wafer W can be prevented. In addition, the starting time required to start an etching process can be shortened.

When etching is completed, the above-described operations, i.e., the generation of a plasma and the application of a voltage to the conductive sheet 16, are stopped. Thereafter, a driving operation for each pusher pin 40 is started to push the wafer W to a position at which the wafer W is transferred to a convey arm (not shown). The process chamber 1 is then opened, and the convey arm is moved therein to receive the wafer W from the pusher pins 40. The convey arm then conveys the wafer W to the outside of the process chamber 1. After this operation, the process chamber 1 is closed to start a charge removal step.

The charge removal step in this embodiment is performed by generating a weak plasma in the process chamber 1. More specifically, the upper case 30 (grounded) and the support surface of the electrostatic chuck 10 are electrically connected to each other through a plasma, thereby removing the residual charges from the support surface.

The process chamber 1 is evacuated first to about 300 Torr. In a plasma process step, the process chamber 1 is normally evacuated to about $10^{-2}$ to 10 Torr. However, in the charge removal step, since only a weak plasma is required, a vacuum of about 300 Torr is sufficient for the step. Subsequently, RF power is supplied from the RF power source 66 to the susceptor 24, and a plasma gas is introduced into the process chamber 1 to generate a weak plasma therein.

In this case, the weak plasma indicates a state of a minimum plasma electron density of, e.g., about $10^8$ to $10^9 \text{ cm}^{-3}$. In order to realize this state, RF power ranging from about 10 to 100 W is applied to the susceptor depending on the capacity of the process chamber 1. The RF power is controlled by the CPU 68. Typically, the capacity of the process chamber 1 is about 1 to 20 l. In this case, the magnitude of the electric field on the support surface of the electrostatic chuck 10 is about 5 $KTe/e\lambda d$ (where $\lambda d$ is the device length, which is equal to $[EoKTe/ne^2]^{\frac{1}{2}}$), which is a free electron density of $10^9$ per 1 cm$^3$ is smaller than 1 mn. The magnitude of this electric field is about 10 to 100 V/cm.

In this case, the peak of the RF power needs to be set within the range of 10 to several hundreds W. If unnecessarily high RF power is applied, the support surface of the electrostatic chuck 10 is sputtered and damaged. The application time of RF power may be set to be long enough to remove the residual charges from the support surface of the electrostatic chuck 10. In an experiment, it took about two seconds to complete this step after application of RF power. If this application time is set to be unnecessarily long, the support surface of the electrostatic chuck 10 may be damaged.

As a plasma gas, an inert gas such as Ar, $N_2$, and He is preferable to prevent damage to the support surface of the electrostatic chuck 10. On the other hand, if the same gas as the etching gas used for the plasma process is used as a plasma gas, since no adjustment by means of the impedance tuner 74 is required, the next etching process can be smoothly started. In general, the following gases can be used: $CHF_3$, $CH_4$, $SF_6$, HBr, HCl, $Cl_2$, $BCl_3$, $CF_2Cl_3$, $SiF_4$, $O_2$, Ar, He, $N_2$, $CO_2$, and the like.

Figure 3:
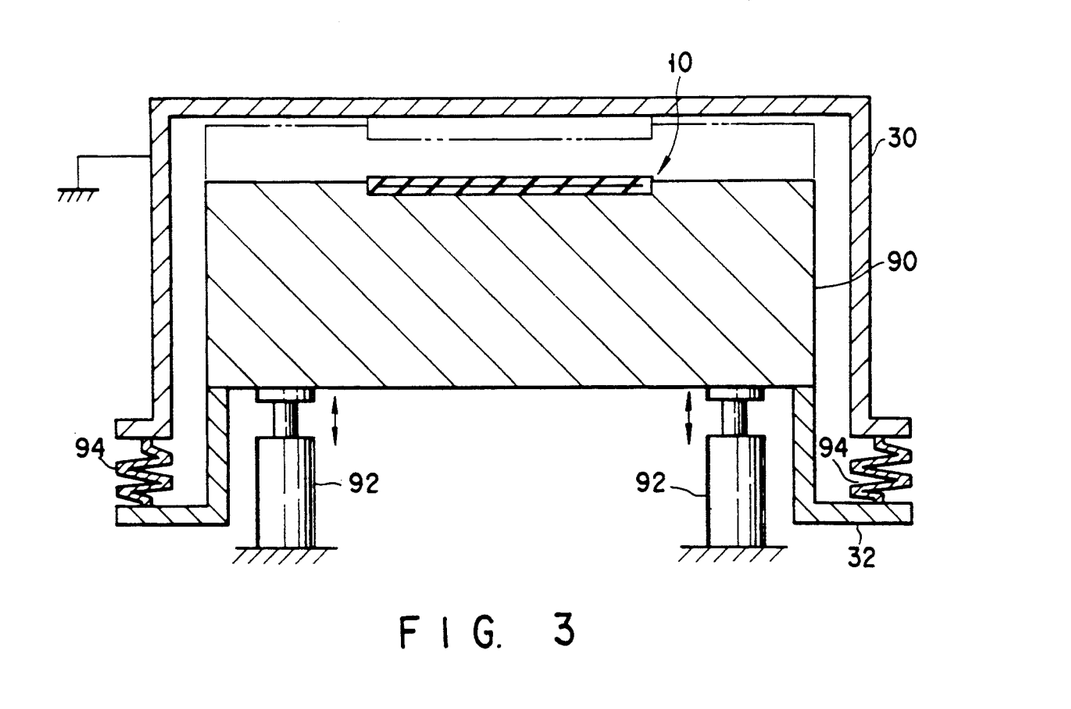
FIG. 3 is a schematic sectional view of a plasma etching apparatus according to another embodiment of the present invention.

FIG. 3 shows a schematic arrangement of an apparatus for realizing another method of removing charges from the support surface of the electrostatic chuck 10.

The plasma etching apparatus shown in FIG. 3 is designed such that a susceptor 90 is vertically moved by a driving means 92. As the driving means 92, a generally used driving mechanism capable of position control, e.g., a hydraulic cylinder, and a structure constituted by a combination of a ball screw, and a rotary motor, can be used. Reference numeral 94 denotes bellows for air-tightly closing a process chamber 1.

In this embodiment, loading of a wafer, etching, and unloading of the wafer are performed in the same sequence as that in the embodiment described above. After the unloading of the wafer, the driving means 92 is operated to move the susceptor 90 upward so as to bring the support surface of the electrostatic chuck 10 disposed on the susceptor 90 into slight contact with the ceiling surface of an upper case 30 (in a charge removal step). Since the upper case 30 is grounded, the residual charges on the support surface of the electrostatic chuck 10 flow to the upper case 30 to be removed.

Still another method of removing charges from the support surface of the electrostatic chuck 10 after an etching process will be described next with reference to FIG. 1.

As previously described above, the pusher pins (unloading means) 40 in the plasma etching apparatus shown in FIG. 1 are grounded through the switch 49. When the wafer W is unloaded after an etching process is completed, the distal ends of the pins 40 are brought into contact with the wafer W on the support surface of the electrostatic chuck 10. Therefore, by closing the switch 49 in this case, the charges on the support surface can be removed. That is, the residual charges on the support surface of the electrostatic chuck 10 flow to the ground through the wafer W and the pins 40 and are removed. In this case, it is preferable that the contact between the wafer W on the support surface and the pins 40 be maintained for a predetermined period of time, e.g., several seconds, to sufficiently remove the charges. Even if a film formed on the wafer W is an insulating film consisting of $SiO_x$ or $SiN_x$, charge removal on the support surface can be performed. For example, a likely reason for this is that the lower surface of a wafer falls outside the range of management for film formation and a film has many defects, and/or most films are sufficiently thin.

The support surface which has undergone a charge removal process need not be set at 0 V, but may be charged at a very low voltage. It is experimentally proved that by performing this charge removal step, the strong attractive force of the electrostatic chuck can be maintained even if a plasma process is repeated.

Note that if the driving means 92 shown in FIG. 3 is incorporated in the apparatus shown in FIG. 1, the pins 40 can be moved relative to the susceptors even in a structure in which the pins 40 are fixed. In this case, the susceptors are lowered by the driving means 92 to allow the pins 40 to come into slight contact with the wafer W.

In addition, residual charges on the support surface of the electrostatic chuck can also be removed by generating a plasma gas outside the process chamber 1 after a wafer is unloaded, and blowing the plasma gas onto the support surface of the electrostatic chuck.

In addition to the apparatuses of the embodiments described above, the above-described plasma process methods can be applied to other various plasma process apparatuses using electrostatic chucks, such as a plasma CVD apparatus and a sputtering apparatus.

Figure 4:
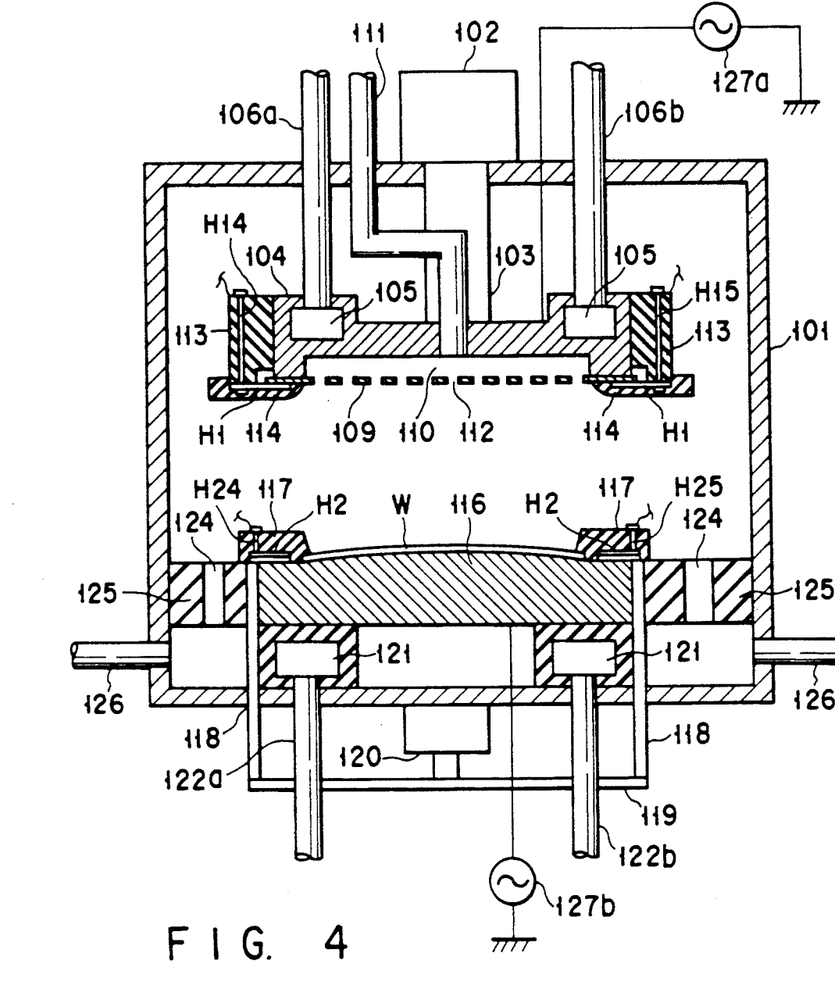
FIG. 4 is a schematic sectional view of a plasma etching apparatus according to still another embodiment of the present invention.

FIG. 4 shows a plasma etching apparatus according to still another embodiment of the present invention. In a plasma process apparatus, reaction products produced in a plasma process tend to adhere to low-temperature portions. Especially, reaction products tend to be deposited on a clamp ring for a wafer and a focus ring on the upper electrode side. The embodiment shown in FIG. 4 and subsequent drawings is designed to solve this problem.

In the apparatus shown in FIG. 4, a hollow box-like process chamber 101 has a hermetic structure for holding a hermetic state therein. The wall portion of the process chamber 101 consists of a conductive material, e.g., aluminum having an anodic oxide surface. A support member 104 connected to an elevating mechanism 102 through a connecting rod 103 is disposed at an upper position in the process chamber 101 so as to be vertically movable. Similar to the process chamber 101, the support member 104 is made of an aluminum material having an anodic oxide surface or the like. The elevating mechanism 102 is constituted by, e.g., an air cylinder, a ball screw, and the like.

Figure 6:
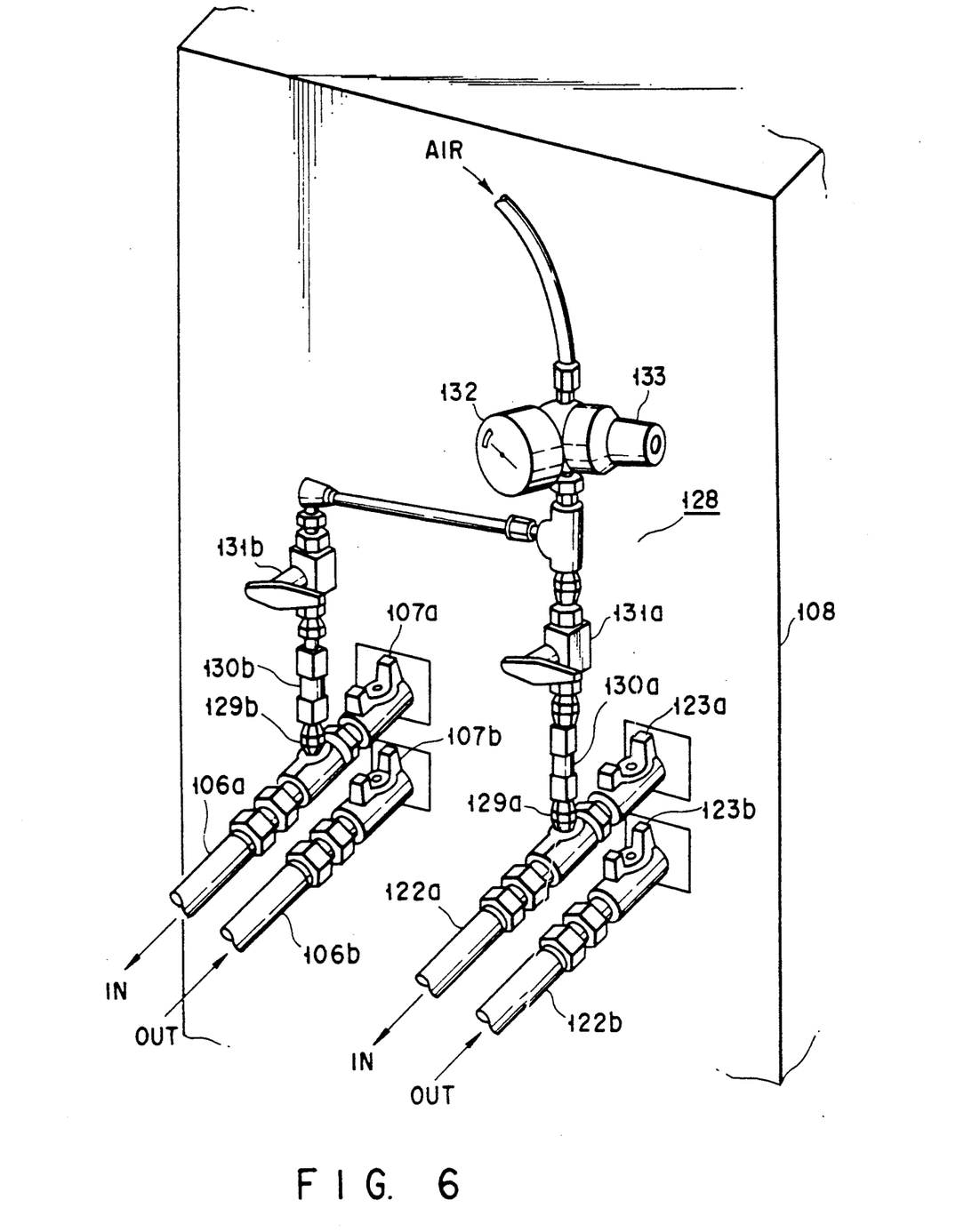
FIG. 6 is a perspective view of a heat transfer medium discharge unit arranged in the apparatus in FIG. 4.
Figure 7:
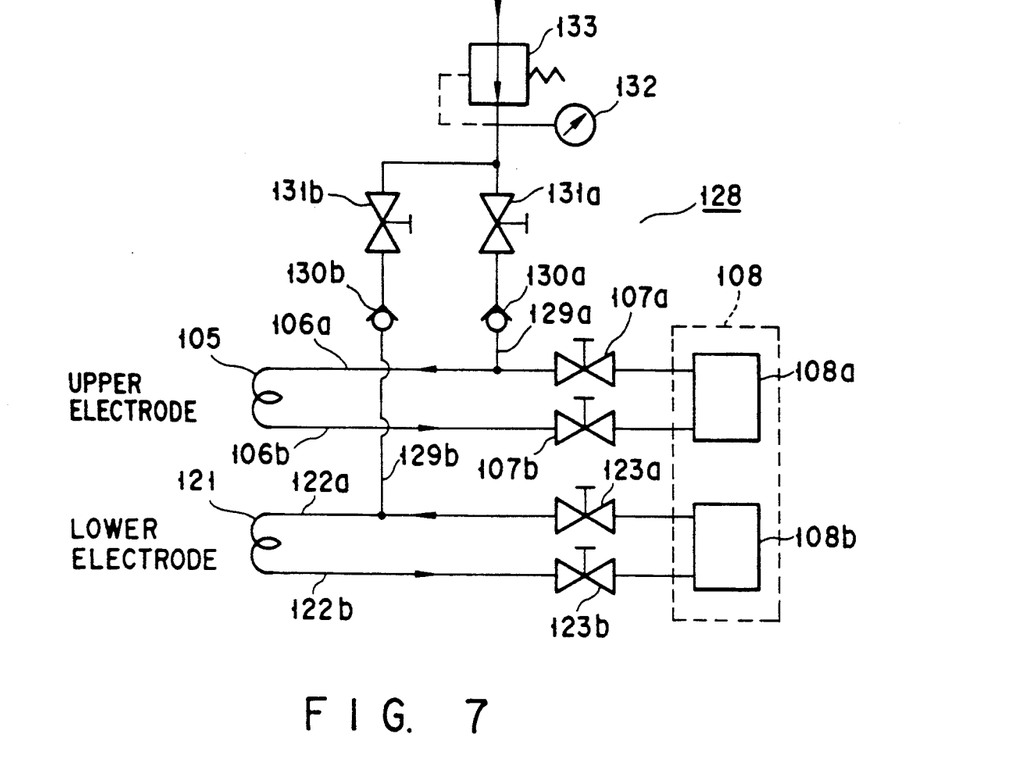
FIG. 7 is a system diagram of the heat transfer medium discharge unit arranged in the apparatus in FIG. 4.

An annular fluid path 105 is formed in the support member 104. A pipe 106a on the inlet (IN) side and a pipe 106b on the outlet (OUT) side shown in FIGS. 6 and 7 are connected to the fluid path 105. These pipes 106a and 106b are coupled to a temperature adjusting unit, e.g., a cooler 108a, through switching valves 107a and 107b, respectively. A heat transfer medium, e.g., a coolant obtained by mixing an anti-freeze with water, whose temperature is adjusted to a predetermined temperature by the cooler 108a circulates through the support member 104 via the pipes 106a and 106b, thereby cooling the support member 104.

An upper electrode 109 consisting of a conductive material such as amorphous carbon is disposed below the lower surface of the support member 104 while the electrode 109 is electrically insulated from the support member 104. A space 110 is formed between the upper electrode 109 and the support member 104. A gas supply pipe 111 is connected to the support member 104 such that the pipe 111 is open to the space 110 from the support member 104 side. The gas supply pipe 111 is coupled to a process gas source (not shown) so that an etching gas is supplied into the space 110 through the gas supply pipe 111. As an etching gas, a halogen gas, e.g., a CF-based gas such as a $CHF_3$ or $CF_4$ gas, is used. A plurality of openings 112 are formed in the upper electrode 109. The gas supplied into the space 110 flows into the process chamber 101 through the openings 112.

An insulating ring 113 is fitted on the support member 104 and the upper electrode 109, and a focus ring 114 is mounted on the lower surface portion of the insulating ring 113. The focus ring 114 consists of an insulating material such as an ethylene tetrafluoride resin and has an annular shape. The focus ring 114 extends from the lower surface portion of the insulating ring 113 to the peripheral portion of the lower surface of the upper electrode 109. The inner diameter of the focus ring 114 is set to be almost equal to the size of an object to be processed, e.g., a semiconductor wafer W. With this arrangement, a plasma having a diameter almost equal to that of the wafer W is generated and is focused on the wafer W.

A ring-like heater H1 is buried in the lower surface (shown in FIG. 4) of the focus ring 114 to be in contact with the lower surfaces of the support member 104 and the upper electrode 109. The structure of the heater H1 will be described in detail later.

A lower electrode 116 on which an object to be processed, e.g., the semiconductor wafer W, is placed is disposed at a lower position in the process chamber 101 so as to oppose the upper electrode 109. The lower electrode 116 is constituted by an aluminum plate whose surface has undergone, e.g., anodic oxidization. The upper surface of the lower electrode 116 is smoothly curved to the periphery to protrude toward the upper electrode 109.

A clamp ring 117 is disposed around the periphery of the lower electrode 116. The clamp ring 117 serves to hold the wafer W by pressing a peripheral portion of the wafer W against the lower electrode 116. The clamp ring 117 is made of an aluminum material whose surface is anodized to form an insulating alumina film, quartz, a ceramic material, or the like. A ring-like heater H2 is buried in the clamp ring 117 to be in contact with the upper surface of the lower electrode 116. The structure of the heater H2 will also be described in detail later.

A plurality of shafts, e.g., four shafts 118 are coupled at positions immediately below the clamp ring 117 to extend outward from the process chamber 101. The distal end portions of these shafts 118 are coupled to an elevating mechanism, e.g., an air cylinder 120, through a ring 119 disposed outside the process chamber 101. With this arrangement, the clamp ring 117 can be freely moved upward and downward.

As each of the heaters H1 and H2 respectively mounted in the focus ring 114 and the clamp ring 117, for example, one of the following heaters may be used. One heater is formed as follows. A refractory metal heating element is embedded in a disk-like ceramic base member. Thereafter, the base member and the heating element are simultaneously calcined to be integrated. The other heater is formed as follows. A heating resistor and a glass layer are printed/stacked on a baked ceramic substrate. The resultant structure is then integrally baked and sintered. The heaters are respectively mounted in annular grooves formed in the focus ring 114 and the clamp ring 117, and are fixed at predetermined positions with fixing means such as bolts (not shown).

Figure 5:
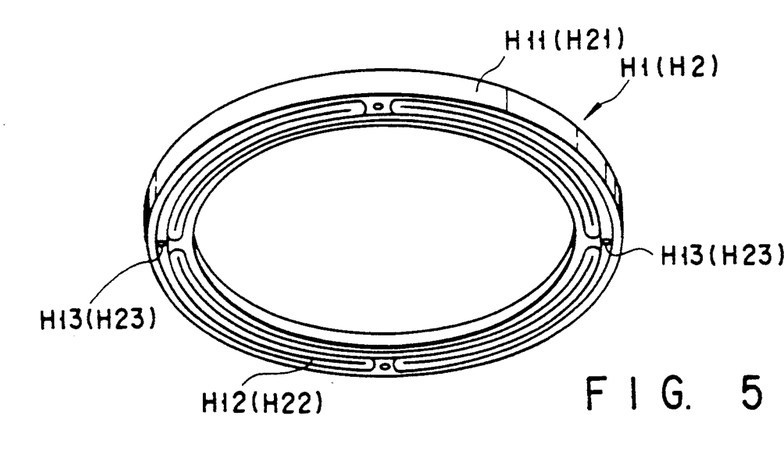
FIG. 5 is a perspective view showing the structure of a heater in the apparatus shown in FIG. 4.

The latter heater has a ring-like thin plate structure such as the one shown in FIG. 5. FIG. 5 shows the structure of the heater H1 for the focus ring 114. The heater H2 has the same structure as that of the heater H1. The same components of the heater H2 as those of the heater H1 are denoted by reference numerals in parenthesis. As ceramic substrates H11 and H21, alumina ceramic substrates, for example, are used. As each of heating resistors H12 and H22, an element formed by mixing nickel (Ni), manganese (Mn), and the like as subcomponents with molybdenum silicide ($MoSi_2$) as a main component is used. Each of the heating resistors H12 and H22 is printed on the substrate in the form of a continuous zigzag pattern such as the one shown in FIG. 5 by screen printing. A crystallized glass coat is formed on each of the heating resistors H12 and H22, thus covering each element.

In addition, as each of the heaters H1 and H2, a compound heater may be used, which is constituted by a heater substrate made of insulating ceramic PBN (Pyrolytic Boron Nitride) manufactured by CVD (Chemical Vapor Deposition), and conductive ceramic PG (Pyrolytic Graphite) deposited on the heater substrate. The use of a heater having this structure can prevent the heating resistor from being exposed in a process gas atmosphere.

The heating temperature of each of the heaters H1 and H2 is set to be higher than room temperature. More specifically, the heating temperature of each heater is changed depending on various process conditions such as the type of a process gas to be used and the type of a reaction product. In this embodiment, the heating temperature of each of the heaters H1 and H2 is set to be higher than 100° C., and each heaters is kept heating during an operation of the apparatus.

Each of the heaters H1 and H2 includes a feeding portion and a temperature-measuring portion. In the respective feeding portions, rod-like conductors H14 and H24 (see FIG. 4) are respectively fixed to connection terminals H13 and H23, formed on the heaters H1 and H2, respectively, with set screws so as to extend upward substantially at right angles. Feeder lead lines are respectively connected to the upper end portions of the rod-like conductors H14 and H24. As a material for the set screws, a material having high gas corrosion resistance, e.g., a stainless material (ASTM 316) is used. The temperature-measuring portions are designed such that rod-like sensors H15 and H25 are respectively contacted with portions of the heating portions of the heaters H1 and H2.

Figure 8:
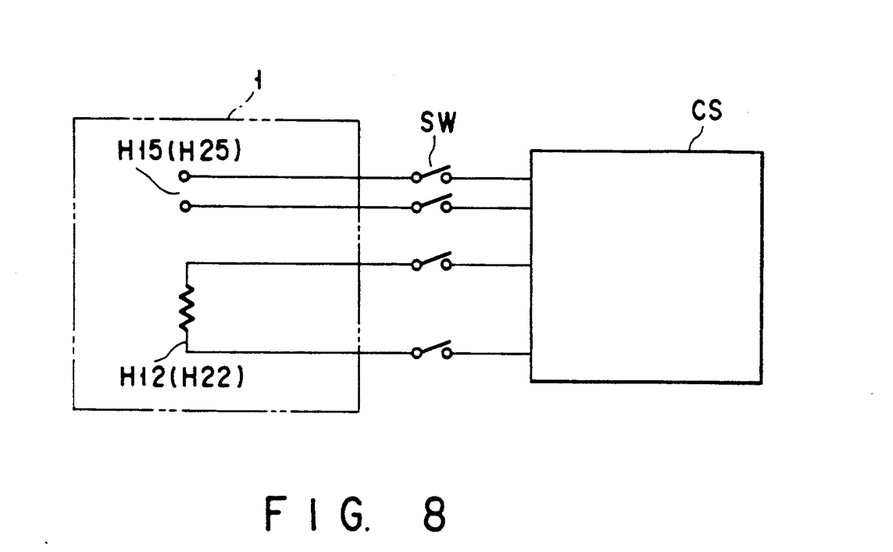
FIG. 8 is a schematic view showing the relationship between the heater and a control section in the apparatus in FIG. 4.

As shown in FIG. 8, switches SW are arranged, outside the process chamber 1, between the heating resistors H12 and H22 and the sensors H15 and H25 of the heaters H1 and H2, and a control section CS therefor. While a plasma is generated in the chamber 1, these switches SW are turned off to separate the heaters H1 and H2 from the control section CS.

FIG. 4 shows the state wherein each feeding portion and a corresponding temperature-measuring portion are arranged to oppose each other, for the sake of descriptive convenience. In practice, however, two pairs of feeding portions and temperature-measuring portions are respectively arranged at positions on orthogonal diagonals such that the feeding portions oppose each other, while the temperature-measuring portions oppose each other.

An annular fluid path 121 is formed in the lower electrode 116. A pipe 122a on the inlet (IN) side and a pipe 122b on the outlet (OUT) side such as those shown in FIGS. 6 and 7 are connected to the fluid path 121. The pipes 122a and 122b are coupled to a temperature adjusting unit, e.g., a cooler 108b, through switching valves 123a and 123b. The cooler 108b constitute an integral cooling unit 108 together with the cooler 108a on the upper electrode 109 side. A heat transfer medium, e.g., a coolant obtained by mixing an anti-freeze with water, whose temperature is adjusted to a predetermined temperature by the cooler 108b circulates through the lower electrode 116 via the pipes 122a and 122b, thereby cooling the lower electrode 116.

An exhaust ring 125 having an exhaust hole 124 is fitted in the gap between the outer surface of the lower electrode 116 and the inner wall of the process chamber 101. Exhaust pipes 126 are open on the side wall of the process chamber 101 at positions in a space which is located below the exhaust ring 125 and communicates with the exhaust hole 124 of the exhaust ring 125. Each exhaust pipe 126 is connected to an exhaust unit or the like (not shown) so that a gas in the process chamber 101 is exhausted outside through the exhaust hole 124 and each exhaust pipe 126.

RF power sources 127a and 127b are electrically connected to the upper and lower electrodes 109 and 116, respectively, thus allowing plasma discharge used for an etching process to occur. The RF power source 127b connected to the lower electrode 116 has an RF output voltage of 380 kHz, whereas the RF power source 127a connected to the upper electrode 109 has an output voltage of a higher frequency of 13.56 MHz.

The above-described etching apparatus includes a heat transfer medium discharge unit 128. More specifically, as shown in FIGS. 6 and 7, a gas supply pipe 129a is connected to either the pipe 106a or the pipe 106b, e.g., the pipe 106a on the inlet (IN) side, used for the coolant circulating through the support member 104 having the upper electrode 109, whereas a gas supply pipe 129b is connected to either the pipe 122a or the pipe 122b, e.g., the pipe 122a on the inlet (IN) side, used for the coolant circulating through the lower electrode 116. The gas supply pipes 129a and 129b are joined to communicate with each other through check valves 130a and 130b and switching valves 131a and 131b. A regulator 133 having a pressure gauge 132 is arranged at the joining/communicating portion. The regulator 133 is connected to a gas source (not shown). A gas, e.g., $N_2$ or air, supplied from the gas source is supplied into the pipe 106a and the pipe 122a after the pressure of the gas is adjusted to a predetermined pressure by the regulator 133.

The heat transfer medium discharge unit 128, as described above, is arranged independently of the pipes 106a and 122b between the two electrodes 109 and 116 and the cooling unit 108. The unit 128 may be arranged as part of the cooling unit 108 or part of the etching apparatus on each side of the electrodes 109 and 116.

The operation and function of the above etching apparatus and a method of etching a wafer will be described next.

An opening/closing mechanism (not shown) for the process chamber 101 is opened first. The semiconductor wafer W as an object to be processed is then loaded in the process chamber 101 through this opening/closing mechanism.

Lifter pins (not shown) which are disposed near the center of the lower electrode 116 to extend through the lower electrode 116 and are designed to be vertically movable are moved upward, and the wafer W is placed on the lifter pins. Thereafter, the lifter pins are lowered to place the wafer W on the surface of the lower electrode 116.

After this operation, the clamp ring 117 is lowered to press a peripheral portion of the wafer W against the lower electrode 116, thus holding the wafer W at a predetermined position.

After the wafer W is supported on the surface of the lower electrode 116 in this manner, the process chamber 101 is set in an air-tight state and a desired vacuum state is set therein. This evacuation operation may be executed in advance by using a known preliminary vacuum chamber when the wafer W is conveyed.

Subsequently, the support member 104 is lowered by the elevating mechanism 102 through the connecting rod 103 to reduce the gap between the upper and lower electrodes 109 and 116 to about several mm for example.

An etching gas, e.g., $CHF_3$ or $CF_4$, is supplied from an etching gas source (not shown) to the space 110 through the gas supply pipe 111. The etching gas supplied to the space 110 flows onto the wafer W through the openings 112 formed in the upper electrode 109. At the same time, an RF power source 127 supplies RF power between the upper and lower electrodes 109 and 116 to cause discharge. The etching gas is converted into a plasma gas by this discharge to generate many types of active species, e.g., $CF_2$ radicals, and the wafer W is etched by using these radicals.

In such an etching process, a reaction product, e.g., $SiF_4$, is produced in the process chamber 101. This reaction product $SiF_4$ becomes a gaseous substance and is exhausted outside through the exhaust holes 124 and the exhaust pipes 126. In this exhaust path, however, this gaseous substance tends to adhere to various portions, especially low-temperature portions. Adhesion of such a reaction product tends to occur first with respect to the surfaces of the focus ring 114 and the clamp ring 117 which are located closest to the etching process portion. However, in the embodiment, the temperatures of the focus ring 114 and the clamp ring 117 are increased by the heaters H1 and H2 incorporated therein to temperatures at which adhesion of reaction products can be prevented, and these temperatures are maintained. This prevents reaction products from adhering to the surfaces of the focus ring 114 and the clamp ring 117. Therefore, the focus ring 114 and the clamp ring 117 can be used for a long period of time while almost no maintenance operations such as cleaning and exchanging operations are required. In addition, since no reaction products peel off from the focus ring 114 and the clamp ring 117, adhesion of reaction products to the wafer W can be prevented.

Upon application of RF power, the upper and lower electrodes 109 and 116 may be heated to high temperatures and thermally expand. In this case, since the upper electrode 109 consists of, e.g., amorphous carbon, and the support member 104 which is in contact therewith consists of, e.g., aluminum, they have different coefficients of thermal expansion. Therefore, cracks may be developed in these members. In order to prevent the development of cracks, a coolant cooled/controlled by the cooler 108a is supplied from the pipe 106a on the inlet (IN) side to the fluid path 105 formed in the support member 104 having the upper electrode 109 and is circulated to be discharged from the pipe 106b on the outlet (OUT) side, thereby indirectly cooling the upper electrode 109.

In addition, if the lower electrode 116 is heated to a high temperature, the temperature of the wafer W is changed to adversely affect the etching process, and a resist layer formed on the wafer W may be damaged. Therefore, the lower electrode 116 is also indirectly cooled by supplying a coolant cooled/controlled by the cooler 108b to the fluid path 121 formed in the lower portion of the lower electrode 116, and circulating the coolant to discharge it from the pipe 122b on the outlet (OUT) side.

When the upper and lower electrodes 109 and 116 are consumed or damaged by such an etching process, or maintenance is required, they need to be replaced with new ones for example. In such a case, the process chamber 101 is set at the atmospheric pressure, and the operation of the cooling unit 108 is stopped. Thereafter, if a coolant pipe on the side of an electrode to be maintained, e.g., the pipe 106a of the support member 104 having the upper electrode 109, is to be maintained, the valve 107a disposed in the pipe 106a of the cooling system for the support member 104 is closed. The valve 131a of the heat transfer medium discharge unit 128 connected to the pipe 106a is opened. Subsequently, the pressure of an $N_2$ gas from a gas source (not shown) is adjusted to a predetermined pressure, e.g., a pressure within the range of 0.25 to 0.35 kg/cm$^2$, and the $N_2$ gas is fed into the pipe 106a through the valve 131a and the check valve 130a.

The presence of the check valve 130a prevents the coolant in the pipe 106a from flowing back into the gas supply pipe 129a. The fed $N_2$ gas flows into the support member 104 having the upper electrode 109 through the pipe 106a to push the coolant, present in the pipe 106a and the support member 104, back into the cooler 108a through the valve 107b. As a means for checking whether the coolant is completely pushed back into the cooler 108a, for example, a sensor for detecting the presence of the coolant in the pipe 106a may be arranged. Alternatively, such a check may be made in such a manner that the cap of a tank (not shown) arranged in the cooler 108a is removed, and bubbles produced by an $N_2$ gas converted from the coolant pushed back into the tank are detected. Immediately after the return of the coolant to the cooler 108a is confirmed by such a means, the valve 107b is closed to prevent the coolant from flowing back to the support member 104. When the maintenance of the electrode is completed, and the operation is to resumed, the valve 131a is closed, and the valves 107a and 107b are opened to resume the operation of the cooling unit 108.

As described above, according to this embodiment, the processing efficiency of objects to be processed can be improved, and adhesion of particles to the surface of each object can be prevented, thereby improving the yield of objects to be processed and the reliability of each processing step.

Figure 9:
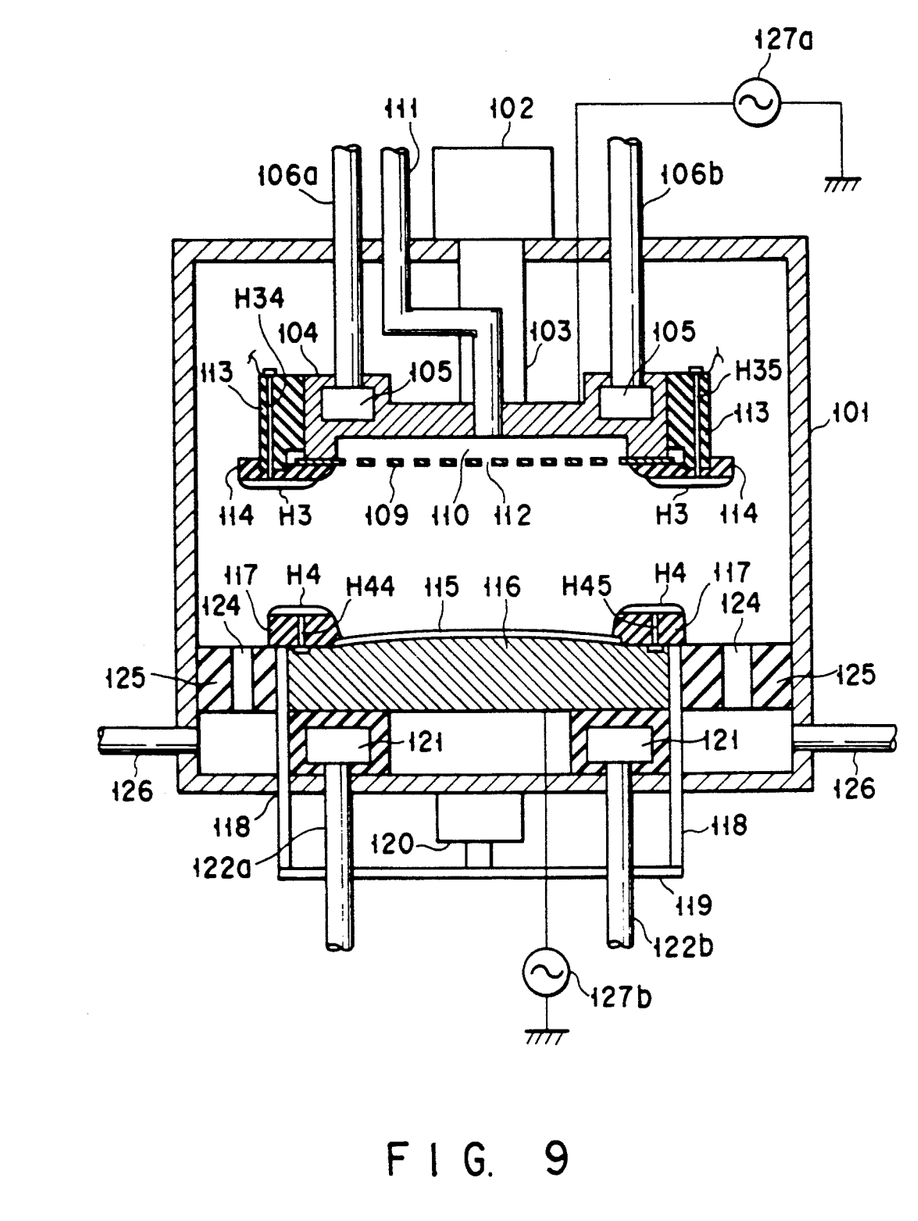
FIG. 9 is a schematic sectional view of a plasma etching apparatus according to still another embodiment of the present invention.

FIG. 9 shows still another embodiment of the present invention. The same reference numerals in the embodiment shown FIG. 9 denote the same parts as in the embodiment shown in FIG. 4, and a description thereof will be omitted.

In this embodiment, heaters H3 and H4 are respectively arranged on the opposing surfaces, i.e., the outer surfaces, of a focus ring 114 and a clamp ring 117. Similar to the previous embodiment, as each of the heaters H3 and H4, one of the following heaters is used for example. One heater is formed as follows. A refractory metal heating element is embedded in a disk-like ceramic base member. Thereafter, the base member and the heating element are simultaneously calcined to be integrated. The other heater is formed as follows. A heating resistor and a glass layer are printed/stacked on a baked ceramic substrate. The resultant structure is then integrally baked and sintered. In either case, a glass coat or the like is formed on each heating resistor to prevent it from being directly exposed, thus preventing it from being corroded by a process gas.

In the respective feeding portions, rod-like conductors H34 and H44 are respectively fixed to the connection terminals of the heaters H3 and H4, respectively, so as to extend upward and downward substantially at right angles. In the respective temperature-measuring portions, rod-like sensors H35 and H45 are respectively contacted with portions of the heating portions of the heaters H3 and H4. FIG. 9 shows the state wherein each feeding portion and a corresponding temperature-measuring portion are arranged to oppose each other, for the sake of descriptive convenience. In practice, however, two pairs of feeding portions and temperature-measuring portions are respectively arranged at positions on orthogonal diagonals such that the feeding portions oppose each other, while the temperature-measuring portions oppose each other.

The present invention described with reference to FIGS. 4 to 9 is not limited to plasma etching apparatuses, and can be applied to all the other apparatuses which perform plasma processes, e.g., a plasma cleaning apparatus, a plasma doping apparatus, and a plasma oxidation apparatus.

According to the aspects of the present invention described with reference to FIGS. 4 to 9, adhesion of reaction products on the surfaces of the clamp ring and the focus ring can be properly prevented to prolong the maintenance cycle of cleaning, replacement, and the like, thereby allowing the use of the rings for a long period of time.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A plasma process method using a plasma process apparatus including:
   a process chamber capable of attaining vacuum;
   a support table for supporting a substrate to be processed in said process chamber;
   an electrostatic chuck arranged on said support table, said electrostatic chuck including a conductive layer and an insulating layer formed on the conductive layer and constituting a substrate support surface;
   conductive support means, arranged in said chamber, for transferring the substrate onto said electrostatic chuck;
   plasma generating means for generating a plasma in said process chamber; and
   means for supplying a heat medium gas between the substrate and said electrostatic chuck, the method comprising the steps of:

placing the substrate on said support means in said process chamber;

applying a potential for electrostatic attraction to said electrostatic chuck;

transferring the substrate onto the insulating layer of said electrostatic chuck by using said support means while said support means is grounded;

releasing contact between the substrate and said support means;

supplying the heat medium gas between the substrate and said electrostatic chuck;

generating a plasma in said process chamber; and processing the substrate by using the plasma.

2. A method according to claim 1, further comprising the step of setting said process chamber in a vacuum state before the potential is applied to said electrostatic chuck.

3. A method according to claim 1, wherein said support means is grounded through a switch, and said switch is turned off when the plasma is generated.

4. A method according to claim 1, wherein said support means includes a plurality of conductive support pins which vertically move to extend through said electrostatic chuck, said support pin retracting into said electrostatic chuck to be released from contact with the substrate.

5. A method according to claim 3, wherein said support means is connected to a driving portion therefor through an insulating member, and is electrically set in a floating state when said switch is turned off.

6. A method according to claim 1, wherein said support table and said process chamber form an electrode pair to generate the plasma, an RF power is applied to said support table, and said process chamber is grounded.

7. A method according to claim 1, wherein the potential for electrostatic attraction is a negative or positive potential supplied by a DC power source.

8. A plasma process method using a plasma process apparatus including:

a process chamber capable of attaining vacuum;

a support table for supporting a substrate to be processed in said process chamber;

an electrostatic chuck arranged on said support table, said electrostatic chuck including a conductive layer and an insulating layer formed on the conductive layer and constituting a substrate support surface; and plasma generating means for generating a plasma in said process chamber, the method comprising the steps of:

processing the substrate by using the plasma in said process chamber in which the plasma is generated, while the substrate is held by said electrostatic chuck;

removing the substrate from said electrostatic chuck upon completion of the process; and removing charges from the substrate support surface when or after contact between the substrate and the substrate support surface of said electrostatic chuck is released.

9. A method according to claim 8, wherein the step of removing the charges from the substrate support surface is performed by generating another plasma in said process chamber after the substrate is unloaded therefrom, and bringing a grounded conductor into contact with said other plasma.

10. A method according to claim 8, wherein an electron density of said other plasma used in the step of removing the charges is lower than that of the plasma used in the step of processing the substrate.

11. A method according to claim 8, wherein the step of removing the charges is performed by bringing the substrate support surface into direct contact with a grounded conductor after the substrate is unloaded from said process chamber.

12. A method according to claim 8, wherein the step of removing the charges is performed by causing a grounded conductive support means to remove the substrate from said electrostatic chuck.

13. A method according to claim 12, wherein said support means includes a plurality of conductive support pins which vertically move to extend through said electrostatic chuck, said support pins protruding from said electrostatic chuck to release contact between the substrate and the substrate support surface.

14. A method according to claim 13, wherein contact between the substrate on the substrate support surface and said support pins is held for a few seconds.

* * * * *

UNITED STATES PATENT AND TRADEMARK OFFICE
CERTIFICATE OF CORRECTION

PATENT NO. : 5,310,453
DATED : May 10, 1994
INVENTOR(S) : Kazuo FUKASAWA, et al.

It is certified that error appears in the above-indentified patent and that said Letters Patent is hereby corrected as shown below:

On the title page, Item [75], the 3rd inventor's city should read as follows:

--Kofu--

Signed and Sealed this

Sixteenth Day of August, 1994

Attest:

BRUCE LEHMAN

Attesting Officer  Commissioner of Patents and Trademarks